US008749000B2

(12) United States Patent
Graham et al.

(10) Patent No.: US 8,749,000 B2
(45) Date of Patent: Jun. 10, 2014

(54) PRESSURE SENSOR WITH DOPED ELECTRODE

(71) Applicant: Robert Bosch GmbH, Stuttgart (DE)

(72) Inventors: Andrew B. Graham, Redwood City, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/767,594

(22) Filed: Feb. 14, 2013

(65) Prior Publication Data

US 2013/0207208 A1  Aug. 15, 2013

Related U.S. Application Data

(60) Provisional application No. 61/599,131, filed on Feb. 15, 2012.

(51) Int. Cl.
*H01L 29/84* (2006.01)
(52) U.S. Cl.
USPC ............ 257/415; 257/410; 257/416; 257/419
(58) Field of Classification Search
None
See application file for complete search history.

(56) References Cited

U.S. PATENT DOCUMENTS

| 4,701,826 | A | 10/1987 | Mikkor |
| 5,369,544 | A | 11/1994 | Mastrangelo |
| 5,470,797 | A | 11/1995 | Mastrangelo |
| 6,744,335 | B2 | 6/2004 | Ryhanen et al. |
| 2004/0248344 | A1 | 12/2004 | Partridge et al. |
| 2007/0170528 | A1 | 7/2007 | Partridge et al. |
| 2008/0099860 | A1* | 5/2008 | Wuertz ..................... 257/415 |
| 2011/0271764 | A1 | 11/2011 | Lee |

FOREIGN PATENT DOCUMENTS

WO     99/32890 A1    7/1999

OTHER PUBLICATIONS

Van Den Boom et al., "Remote CMOS Pressure Sensor Chip with Wireless Power and Data Transmission", IEEE International Solid-State Circuits Conference, 2000, Germany (3 pages).
Stangel et al., "A Programmable Intraocular CMOS Pressure Sensor System Implant", IEEE Journal of Solid State Circuits, 2001, pp. 1094-1100, vol. 36, No. 7, Germany (7 pages).
Zarbin et al., "Nanotechnology in ophthalmology", Canadian Journal of Ophthalmology, 2010, pp. 457-476, vol. 45, No. 5, USA (20 pages).
International Search Report and Written Opinion in corresponding International Application (i.e., PCT/US2013/026192), mailed Aug. 5, 2013 (10 pages).

* cited by examiner

*Primary Examiner* — Kyoung Lee
(74) *Attorney, Agent, or Firm* — Maginot, Moore & Beck

(57) ABSTRACT

In one embodiment, a sensor device includes a bulk silicon layer, a first doped region of the bulk silicon layer of a first dopant type, a second doped region of the bulk silicon layer of a second dopant type, wherein the first dopant type is a type of dopant different from the second dopant type, the second doped region located at an upper surface of the bulk silicon layer and having a first doped portion bounded by the first doped region, a first cavity portion directly above the second doped region, and an upper electrode formed in an epitaxial layer, the upper electrode directly above the first cavity portion.

20 Claims, 4 Drawing Sheets

PRESSURE SENSOR WITH DOPED ELECTRODE

This application claims the benefit of U.S. Provisional Application No. 61/599,131 filed Feb. 15, 2012, the entire contents of which is herein incorporated by reference.

FIELD OF THE INVENTION

This disclosure relates to capacitive micromechanical electrical system (MEMS) pressure sensors.

BACKGROUND

A capacitive MEMS pressure sensor requires two electrodes that move relative to each other under an applied pressure. This is most often accomplished by having a fixed electrode (hereafter called the lower electrode) formed in a substrate while a moveable electrode (hereafter called the upper electrode) is provided in a deformable membrane which is exposed to the pressure that is to be sensed. One or more of the electrodes are typically formed by deposition of a conductive film, electrical isolation of a conductive layer, or by simply adding a spacer layer between two conductive materials.

While known methods of forming electrodes are effective, such electrodes may introduce undesired properties or process steps into a device. By way of example, deposition of material requires additional process steps thereby complicating manufacturing processes. Moreover, use of different materials can result in undesired stress at the material junction, thermal mismatch in materials, etc.

Additionally, when an electrode is formed by deposition, an electrically isolated lower layer is required such as may be provided by a silicon-on-insulator (SOI) wafer or the like. Providing such isolated lower layers increases device complexity including the need for additional materials and processing steps. Moreover, devices incorporating deposited electrodes may exhibit reduced electrical isolation which leads to increased feedthrough capacitance and reduced shielding, thereby reducing the performance of the final sensor.

What is needed therefore is a simple and reliable device with an out-of-plane electrode and method for producing the device. A device incorporating an out-of-plane electrode that is easily fabricated with an encapsulated vacuum would be further beneficial.

SUMMARY

A capacitive MEMS pressure sensor in one embodiment includes a deposited epi-polysilicon layer as a deformable upper membrane. In some embodiments, dielectric spacers are used to isolate an electrode within this deformable membrane. Such spacers are described in U.S. patent application Ser. No. 13/232,209, filed on Sep. 14, 2011, the entire contents of which are herein incorporated by reference. A lower electrode is defined in bulk silicon by a P-N junction capable of providing sufficient electrical isolation between the electrode and the surrounding bulk silicon. The lower electrode is formed in some embodiments by using a high energy dopant implant that creates a highly N-type region within a highly P-type substrate (or vice versa) after a mask has been formed on the substrate. The junction between the two regions of different doping can be tailored to provide sufficient electrical properties for the sensor.

In some embodiments, the pressure sensor is stacked on top of pre-existing structures to create a wafer-scale encapsulation process capable of producing a wide range of devices. One method of stacking structures is described in U.S. patent application Ser. No. 13/232,209, filed on Sep. 14, 2011, the entire contents of which are herein incorporated by reference.

In one embodiment, a sensor device includes a bulk silicon layer, a first doped region of the bulk silicon layer of a first dopant type, a second doped region of the bulk silicon layer of a second dopant type, wherein the first dopant type is a type of dopant different from the second dopant type, the second doped region located at an upper surface of the bulk silicon layer and having a first doped portion bounded by the first doped region, a first cavity portion directly above the second doped region, and an upper electrode formed in an epitaxial layer, the upper electrode directly above the first cavity portion.

In another embodiment, a method of forming a sensor device includes providing a bulk silicon layer, doping a first region of the bulk silicon layer with a first dopant type to form a first doped region, doping a portion of the first region with a second dopant type, wherein the first dopant type is a type of dopant different from the second dopant type, to form a second doped region, forming a first cavity portion directly above the second doped region, and forming an upper electrode formed an epitaxial layer, the upper electrode directly above the first cavity portion.

In one embodiment, A sensor device includes a bulk silicon layer, a first doped region of the bulk silicon layer of a first dopant type, a second doped region of the bulk silicon layer of a second dopant type, wherein the first dopant type is a type of dopant different from the second dopant type, the second doped region located at an upper surface of the bulk silicon layer and having a first doped portion bounded by the first doped region, a first cavity portion over the second doped region, and an upper electrode formed in a deposited cap layer, the upper electrode over the first cavity portion.

In another embodiment, a method of forming a sensor device includes providing a bulk silicon layer, doping a first region of the bulk silicon layer with a first dopant type to form a first doped region, doping a portion of the first region with a second dopant type, wherein the first dopant type is a type of dopant different from the second dopant type, to form a second doped region, forming a first cavity portion over the second doped region, and forming an upper electrode formed a deposited cap layer, the upper electrode over the first cavity portion.

In yet another embodiment, A sensor device includes a bulk silicon layer, a first doped region of the bulk silicon layer of a first dopant type, a second doped region of the bulk silicon layer of a second dopant type, wherein the first dopant type is a type of dopant different from the second dopant type, the second doped region located at an upper surface of the bulk silicon layer and having a first doped portion bounded by the first doped region, a first cavity portion directly above the second doped region, and an upper electrode formed in a deposited cap layer, the upper electrode adjacent the first cavity portion.

In another embodiment, A sensor device includes a bulk silicon layer, a first doped region of the bulk silicon layer of a first dopant type, a second doped region of the bulk silicon layer of a second dopant type, wherein the first dopant type is a type of dopant different from the second dopant type, the second doped region located at an upper surface of the bulk silicon layer and having a first doped portion bounded by the first doped region, a first cavity portion directly above the second doped region, and an upper electrode formed in an epitaxial layer, the upper electrode directly above the first cavity portion.

DESCRIPTION

Figure 1:
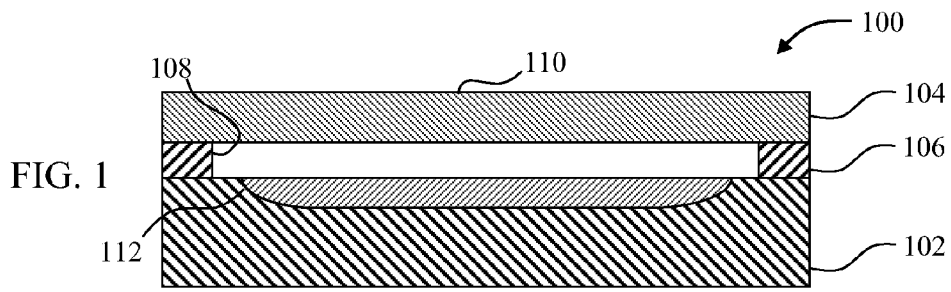
FIG. 1 depicts a side cross-sectional view of a sensor device incorporating a lower electrode formed by doping a bulk silicon substrate in accordance with principles of the disclosure.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a pressure sensor 100 including a bulk silicon layer 102 and a cap layer 104. The cap layer 104 may be formed using any desired depositing technique including, but not limited to, epitaxial, chemical vapor deposition (CVD), low pressure chemical vapor deposition (LPCVD), and plasma enhanced chemical vapor deposition (PECVD). A spacer layer 106 is positioned between the bulk silicon layer 102 and the cap layer 104. A cavity 108 in the spacer layer 106 is located between an upper electrode portion 110 and a lower electrode portion 112.

The bulk silicon layer 102 is highly doped and may be a wafer or an upper layer of a previously formed structure formed by a desired process. In this embodiment, the bulk silicon layer 102 is P-type doped, although other doping may be used if desired. The lower electrode 112 is an N++ doped region of the bulk silicon layer 102.

The different doping of the lower electrode 112 and the bulk silicon layer 102 provides electrical isolation between the lower electrode 112 and the bulk silicon layer 102. Moreover, because the lower electrode 112 is implanted there is no need for a material deposition to create the lower electrode 112. Accordingly, the overall design of the pressure sensor 100 is simplified and risks associated with introducing an additional material (stress, thermal mismatch, etc.) are eliminated.

Additionally, the use of different doping within a single substrate eliminates the need for silicon-on-insulator (SOI) wafers (or similar) to provide an electrically isolated lower layer. Thus, the complexity of the pressure sensor 100 in some embodiments is simplified by eliminating materials and processing steps such as etching of electrical isolation features.

Furthermore, only a limited portion of the bulk silicon layer 102 is used as an electrode, resulting in improved electrical isolation which leads to reduced feedthrough capacitance and better shielding. The foregoing advantages result in improved performance of the pressure sensor 100.

Figure 2:
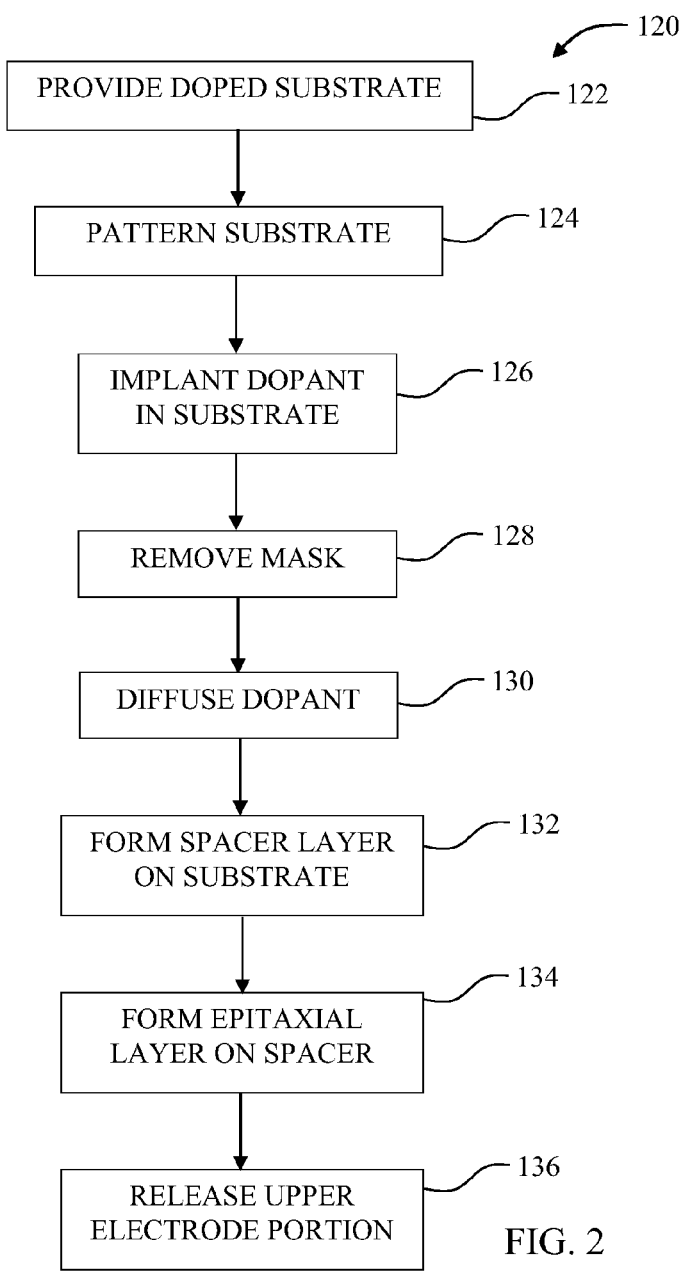
FIG. 2 depicts a process which may be used to form the sensor of FIG. 1.

A process 120 for forming a sensor such as the pressure sensor 100 is discussed with reference to FIG. 2. Initially, a bulk silicon layer is provided at block 122. The bulk silicon layer is highly doped and in one embodiment is a wafer and in another embodiment is an upper layer of a previously formed structure. At block 124, a photoresist pattern or other mask is formed on the upper surface of the bulk silicon layer. The exposed upper surface of the bulk silicon layer that is not covered by the photoresist or mask defines the desired electrode shape.

A lower electrode is formed in the bulk silicon layer through the exposed surface of the bulk silicon layer by a desired doping procedure (block 126). In one embodiment, a high energy dopant implant is used while in another embodiment furnace doping is used. The dopant is selected to be a dopant that is different from the dopant used when providing the doped bulk silicon layer at block 122. Accordingly, in one embodiment a P-type dopant is used at block 122 and an N-type dopant is used at block 126. In another embodiment, an N-type dopant is used at block 122 and a P-type dopant is used at block 126.

Once a desired amount of dopant has been implanted at block 126, the photoresist layer or mask formed at block 124 is removed (block 128). The implanted dopant is then diffused into the bulk silicon layer (block 130). Diffusion, which in some embodiments is performed at a different point in the process, is accomplished in some embodiments by elevated temperature activation. A spacer layer is then formed on the upper surface of the substrate and the upper surface of the doped electrode at block 132. The spacer layer in some embodiments is a silicon dioxide. In some embodiments, the spacer layer is deposited while in other embodiments the spacer layer is thermally grown.

At block 134 an epitaxial polysilicon cap layer is formed on the upper surface of the spacer layer. The epi-poly deposition layer may be deposited in the manner described by Candler et al., "Long-Term and Accelerated Life Testing of a Novel Single-Wafer Vacuum Encapsulation for MEMS Resonators", *Journal of Microelectricalmechanical Systems*, vol. 15, no. 6, December 2006. A portion of the spacer layer is then etched to release a portion of the cap layer (block 136). The etch may be accomplished by any desired process. In some embodiments, etch holes are used as generally described in U.S. patent application Ser. No. 13/232,209.

Figure 3:
FIG. 3 depicts a side cross-sectional view of a doped bulk silicon substrate which may be provided in accordance with the process of FIG. 2.
Figure 4:
FIG. 4 depicts a side cross-sectional view of the doped bulk silicon substrate of FIG. 3 with a mask formed on the upper surface of the substrate.

The process 120 is further illustrated by reference to FIGS. 3-9. Referring initially to FIG. 3, a bulk silicon layer 150 is provided (block 122). FIG. 4 depicts a patterned photoresist layer 152 positioned on the upper surface of the bulk silicon layer 150 with a portion 154 of the upper surface of the bulk silicon layer exposed (block 124).

Figure 5:
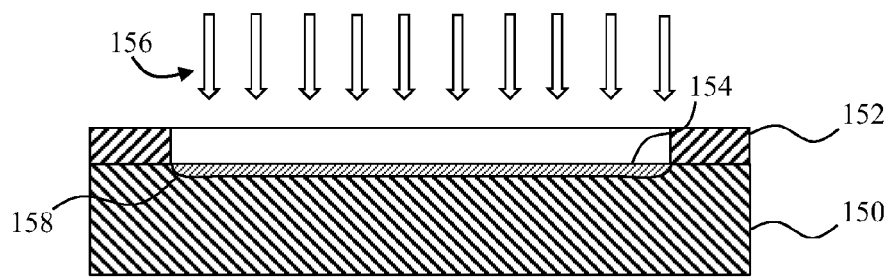
FIG. 5 depicts a side cross-sectional view of the device of FIG. 3 with an unmasked portion of the doped bulk silicon substrate exposed to a high energy dopant to create a lower electrode.
Figure 6:
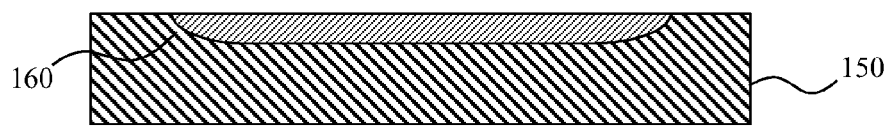
FIG. 6 depicts a side cross-sectional view of the device of FIG. 5 with the mask layer removed after the lower electrode has been formed.

FIG. 5 depicts a high-energy dopant 156 being directed to the exposed portion 154 of the upper surface of the bulk silicon layer 150 thereby implanting dopant 158 at the upper surface of the exposed portion 154 (block 126). FIG. 6 depicts the bulk silicon layer 150 after the mask layer has been removed (block 128) and the implanted dopant has been diffused (block 130) to form a doped electrode 160.

Figure 7:
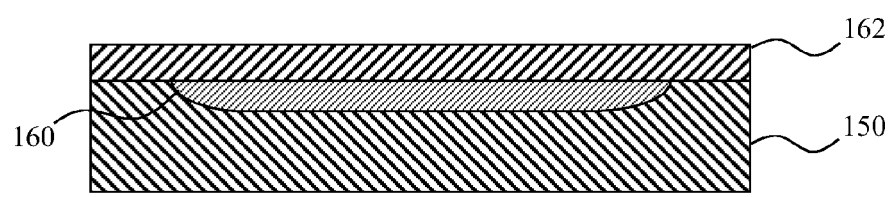
FIG. 7 depicts a side cross-sectional view of the device of FIG. 6 with a spacer layer formed above the upper surface of the doped bulk silicon substrate and above the doped lower electrode.
Figure 8:
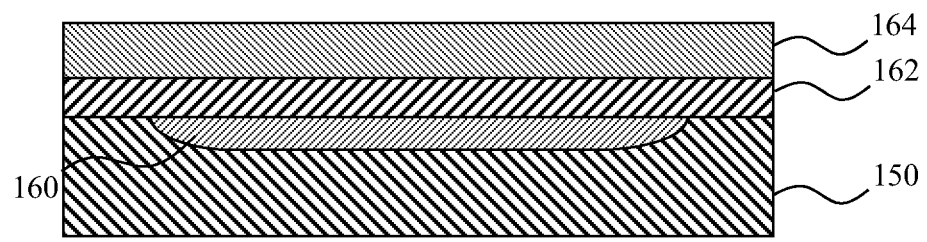
FIG. 8 depicts a side cross-sectional view of the device of FIG. 7 with an epitaxial cap layer portion formed above the spacer layer.
Figure 9:
FIG. 9 depicts a side cross-sectional view of the device of FIG. 8 with a void area formed beneath the epitaxial cap layer portion and above the doped electrode formed in the spacer layer.

FIG. 7 depicts a spacer layer 162 formed on the upper surface of the bulk silicon layer 150 and on the upper surface of the doped electrode 160 (block 132). FIG. 8 depicts an epitaxial formed layer cap 164 deposited on the upper surface of the spacer layer 162 and FIG. 9 depicts a cavity 164 formed in the spacer layer 162 at a location directly above the doped electrode 160 (block 134), thereby releasing the cap layer 164 to create a deformable membrane which functions as an upper electrode (block 136).

While process 120 and FIGS. 3-9 are provided to describe one embodiment of a process, modifications to the process 120 including additional actions before, during, and after the actions described above are incorporated into other embodiments to provide different structures or simply a different order of the process steps.

Figure 10:
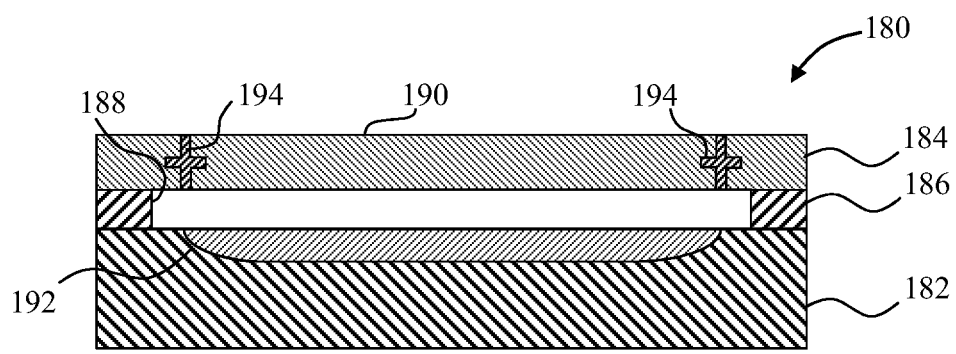
FIG. 10 depicts a side cross-sectional view of a sensor device incorporating a lower electrode formed by doping a bulk silicon substrate with an upper electrode defined by dielectric spacers in an epitaxial cap layer in accordance with principles of the disclosure.

One embodiment of a device formed by such modification is provided in FIG. 10. The pressure sensor 180 of FIG. 10 includes a bulk silicon layer 182 and an epitaxially formed cap layer 184. A spacer layer 186 is positioned between the bulk silicon layer 182 and the cap layer 184. A cavity 188 in the spacer layer 186 is located between an upper electrode portion 190 and a lower electrode portion 192. The pressure sensor 180 is thus similar to the pressure sensor 100.

The pressure sensor 180 differs from the pressure sensor 100 in that the upper electrode portion 190 is defined within the cap layer 184 by a nitride spacer 194 that defines an outer perimeter of the electrode portion 190 within the cap layer 184. The nitride spacer in one embodiment is formed in a manner described in U.S. patent application Ser. No. 13/232, 209. As in the case of the pressure sensor 100, additional fabrication processes may be used to further define structures and connections.

Figure 11:
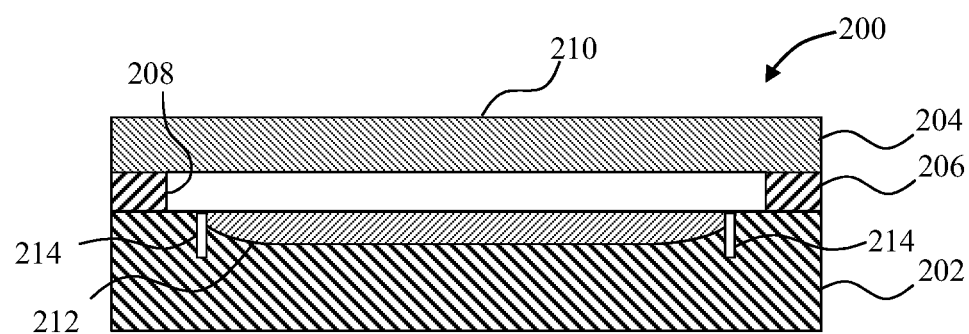
FIG. 11 depicts a side cross-sectional view of a sensor device incorporating a lower electrode formed by doping a bulk silicon substrate and further defined by a trench formed in the bulk silicon substrate in accordance with principles of the disclosure.

Another embodiment of a device formed by such modification is provided in FIG. 11. The pressure sensor 200 of FIG. 11 includes a bulk silicon layer 202 and an epitaxially formed cap layer 204. A spacer layer 206 is positioned between the bulk silicon layer 202 and the cap layer 204. A cavity 208 in the spacer layer 206 is located between an upper electrode portion 210 and a lower electrode portion 212. The pressure sensor 200 is thus similar to the pressure sensor 100.

The pressure sensor 200 differs from the pressure sensor 100 in that the lower electrode portion 212 is defined within the bulk silicon layer 202 by a trench 214 that defines an outer perimeter of the electrode portion 212 within the bulk silicon layer 202. The trench 214 may be formed at any desirable point of a manufacturing process. Moreover, in one embodiment a device includes both a trench 214 defining a lower electrode and a spacer 194 defining an upper electrode. In another embodiment, the trench 214 of the pressure sensor 200 may be filed with materials including silicon dioxide, silicon nitride, ALD alumina, or any other dielectric materials, as desired by those of ordinary skill in the art. In another embodiment, a post instead of a trench and spacer may be either disposed between the layers, over at least one of the layers, or within at least one of the layers.

Figure 12:
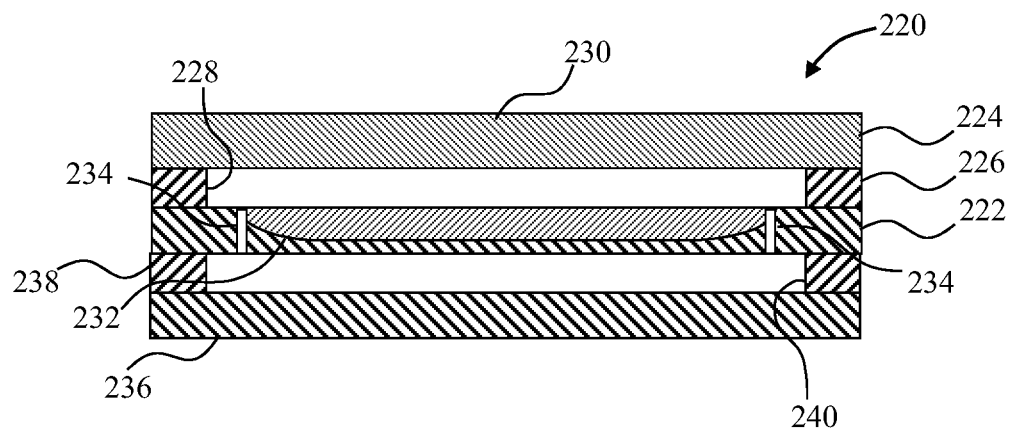
FIG. 12 depicts a side cross-sectional view of a sensor device incorporating a lower electrode formed by doping a bulk silicon substrate and further defined by a trench formed in the bulk silicon substrate, all positioned on an existing structure fabricated in a silicon on insulator wafer in accordance with principles of the disclosure.

Yet another embodiment of a device formed by such modification is provided in FIG. 12. The pressure sensor 220 of FIG. 12 includes a bulk silicon layer 222 and an epitaxially formed cap layer 224. A spacer layer 226 is positioned between the bulk silicon layer 222 and the cap layer 224. A cavity 228 in the spacer layer 226 is located between an upper electrode portion 230 and a lower electrode portion 232. The lower electrode portion 232 is defined within the bulk silicon layer 222 by a trench 234 that defines an outer perimeter of the electrode portion 232 within the bulk silicon layer 222. The pressure sensor 220 is thus similar to the pressure sensor 200.

The pressure sensor 220 differs from the pressure sensor 200 in that the bulk silicon layer 222 is supported by a silicon substrate 236 which in one embodiment is a part of a SOI wafer. The bulk silicon layer 222 is spaced apart from the silicon substrate 236 by a spacer layer 238. In the embodiment of FIG. 12, a cavity 240 is formed below the lower electrode portion 232 in the spacer layer 238 and the trench 234 extends from the cavity 228 to the cavity 240. In other embodiments, the trench 234 does not connect the two cavities. The pressure sensor 220 thus includes both a pressure sensing portion as well as other sensor(s) or electronics that may be provided within the SOI wafer which includes the silicon layer 236, defines a stacked sensor device. In another embodiment, the pressure sensor 220 is formed without a trench 234 and a dielectric spacer 194. In yet another embodiment, the pressure sensor 220 is formed with a dielectric spacer 194 and the spacer 194 communicates with at least one of the cavity 228 and the spacer 226.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A sensor device, comprising:
    a bulk silicon layer;
    a first doped region of the bulk silicon layer of a first dopant type;
    a second doped region of the bulk silicon layer of a second dopant type, wherein the first dopant type is a type of dopant different from the second dopant type, the second doped region located at an upper surface of the bulk silicon layer and having a first doped portion bounded by the first doped region;
    a first cavity portion over the second doped region; and
    an upper electrode formed in a deposited cap layer, the upper electrode over the first cavity portion.

2. The sensor device of claim 1 further comprising:
    a spacer formed in the deposited cap layer and defining a portion of the upper electrode.

3. The sensor device of claim 2, wherein the deposited cap layer is formed by at least one of an epitaxial process, a CVD process, a LPCVD process, and a PECVD process.

4. The sensor device of claim 1, further comprising:
a trench formed in the bulk silicon layer and separating a portion of the second doped region from a portion of the first doped region.

5. The sensor device of claim 4, wherein:
the trench is filled with a dielectric material, and
the dielectric material includes at least one of silicon dioxide, silicon nitride, and ALD alumina.

6. The sensor device of claim 4, further comprising:
a second cavity portion formed below the first doped region; and
a substrate layer formed below the second cavity portion.

7. The sensor device of claim 6, wherein the trench extends from the first cavity portion to the second cavity portion.

8. The sensor device of claim 1, further comprising:
a substrate layer; and
a second cavity portion formed at the interface between the substrate layer and the first doped region.

9. The sensor device of claim 1, wherein:
the first doped region is a P-type doped region; and
the second doped region is an N++ type doped region.

10. A method of forming a sensor device, comprising:
providing a bulk silicon layer;
doping a first region of the bulk silicon layer with a first dopant type to form a first doped region;
doping a portion of the first region with a second dopant type, wherein the first dopant type is a type of dopant different from the second dopant type, to form a second doped region;
forming a first cavity portion over the second doped region; and
forming an upper electrode in a deposited cap layer, the upper electrode over the first cavity portion.

11. The method of claim 10 further comprising:
defining a portion of the upper electrode by forming a spacer in the deposited cap layer.

12. The method of claim 10, further comprising:
forming a trench in the bulk silicon layer between a portion of the second doped region and a portion of the first doped region.

13. The method of claim 12, further comprising:
forming a second cavity portion between the first doped region and a substrate layer portion.

14. The method of claim 13, wherein the trench extends from the first cavity portion to the second cavity portion.

15. The method of claim 12, further comprising:
at least partially filling the trench with a dielectric material, wherein the dielectric material includes at least one of silicon dioxide, silicon nitride, and ALD alumina.

16. A sensor device comprising:
a deposited cap layer;
a first electrode formed in an epitaxial layer;
a bulk silicon layer;
a first cavity formed between the deposited cap layer and the bulk silicon layer; and
a doped region formed at an upper surface of the bulk silicon layer adjacent to the first cavity, defining a second electrode.

17. The sensor device of claim 16, further comprising:
a member formed in one of the deposited cap layer and the bulk silicon layer, and communicating with the first cavity.

18. The sensor device of claim 17, further comprising:
a substrate; and
a second cavity formed between the substrate and the bulk silicon layer.

19. The sensor device of claim 18, wherein the member extends from the first cavity to the second cavity.

20. The sensor device of claim 17, wherein the member includes at least one of a trench, a spacer, and a post.

* * * * *